(12) United States Patent
Takeuchi et al.

(10) Patent No.: US 9,399,725 B2
(45) Date of Patent: Jul. 26, 2016

(54) TEMPORARY BONDING ADHESIVE FOR A SEMICONDUCTOR WAFER AND METHOD FOR MANUFACTURING A SEMICONDUCTOR DEVICE USING THE SAME

(75) Inventors: Etsu Takeuchi, Tokyo (JP); Junya Kusunoki, Tokyo (JP); Hiromichi Sugiyama, Tokyo (JP); Toshiharu Kuboyama, Tokyo (JP); Masakazu Kawata, Tokyo (JP)

(73) Assignee: SUMITOMO BAKELITE CO., LTD., Tokyo (JP)

( * ) Notice: Subject to any disclaimer, the term of this patent is extended or adjusted under 35 U.S.C. 154(b) by 875 days.

(21) Appl. No.: 13/126,999

(22) PCT Filed: Jun. 15, 2010

(86) PCT No.: PCT/JP2010/060080
§ 371 (c)(1),
(2), (4) Date: Jun. 30, 2011

(87) PCT Pub. No.: WO2010/147102
PCT Pub. Date: Dec. 23, 2010

(65) Prior Publication Data
US 2011/0318938 A1 Dec. 29, 2011

Related U.S. Application Data

(60) Provisional application No. 61/221,405, filed on Jun. 29, 2009.

(30) Foreign Application Priority Data

Jun. 15, 2009 (JP) .................................. 2009-142688
Jun. 30, 2009 (KR) ........................ 10-2009-0059142
Nov. 6, 2009 (EP) ...................................... 09175311

(51) Int. Cl.
| | |
|---|---|
| H01L 21/31 | (2006.01) |
| H01L 21/469 | (2006.01) |
| C09J 169/00 | (2006.01) |
| C09D 177/00 | (2006.01) |
| C09D 179/08 | (2006.01) |
| H01L 21/683 | (2006.01) |

(52) U.S. Cl.
CPC .............. C09J 169/00 (2013.01); C09D 177/00 (2013.01); C09D 179/08 (2013.01); H01L 21/6835 (2013.01); H01L 21/6836 (2013.01); H01L 2221/6834 (2013.01); H01L 2221/68327 (2013.01); H01L 2221/68386 (2013.01)

(58) Field of Classification Search
CPC ... C09D 177/00; C09D 179/08; C09J 169/00; H01L 21/6836; H01L 21/6835; H01L 2221/68386; H01L 2221/68327; H01L 2221/6834
USPC .................. 438/64–67, 87, 759; 257/E21.09, 257/E21.214, E21.237, E21.499; 522/26
See application file for complete search history.

(56) References Cited

U.S. PATENT DOCUMENTS

| | | | |
|---|---|---|---|
| 2005/0276934 A1 | 12/2005 | Fukui et al. | |
| 2006/0175585 A1* | 8/2006 | Drotleff et al. | ............... 252/582 |
| 2010/0233838 A1* | 9/2010 | Varghese | ......................... 438/64 |
| 2010/0297829 A1* | 11/2010 | O'Rourke | ..................... 438/459 |

FOREIGN PATENT DOCUMENTS

| | | | |
|---|---|---|---|
| JP | 63030856 A * | 2/1988 | |
| JP | 2004/186263 A | 7/2004 | |
| JP | 2004231938 A * | 8/2004 | |
| JP | 2004-256788 A | 9/2004 | |
| JP | 2005-023205 A | 1/2005 | |
| JP | 2005154765 A * | 6/2005 | |
| JP | 2005-232320 A | 9/2005 | |
| JP | 2005-232321 A | 9/2005 | |
| JP | 2006-503335 A | 1/2006 | |
| JP | 2006-504853 A | 2/2006 | |
| WO | WO 2004/036264 A2 | 4/2004 | |
| WO | WO 2004/042797 A2 | 5/2004 | |
| WO | WO 2004/050762 A1 | 6/2004 | |
| WO | WO 2008/005979 A1 | 1/2008 | |

OTHER PUBLICATIONS

Extended European Search Report issued Jul. 10, 2012, in European Patent Application No. 09175311.1.
Extended European Search Report issued Jul. 10, 2012, in European Patent Application No. 10789477.6.
International Search Report, PCT/JP2010/060080, Aug. 17, 2010.

* cited by examiner

*Primary Examiner* — Charles Garber
*Assistant Examiner* — Abdulfattah Mustapha
(74) *Attorney, Agent, or Firm* — Birch, Stewart, Kolasch & Birch, LLP

(57) ABSTRACT

To provide a temporary bonding adhesive for a semiconductor wafer that reduces damage to a semiconductor wafer, makes it readily detachable, and can shorten the time required for thermal decomposition, and a manufacturing method for a semiconductor device using this.
A temporary bonding adhesive for a semiconductor wafer, being a temporary bonding adhesive used for temporarily bonding a semiconductor wafer onto a supporting substrate in order to process a semiconductor wafer, and for detaching a semiconductor wafer from a supporting substrate by heating after processing, containing a resin composition whereof the 50% weight loss temperature decreases after irradiation by active energy rays.

23 Claims, No Drawings

TEMPORARY BONDING ADHESIVE FOR A SEMICONDUCTOR WAFER AND METHOD FOR MANUFACTURING A SEMICONDUCTOR DEVICE USING THE SAME

This application is the National Phase of PCT/JP2010/060080 filed on Jun. 15, 2010, which claims priority under 35 U.S.C. 119(e) to U.S. Provisional Application No. 61/221,405 filed on Jun. 29, 2009 and under 35 U.S.C. 119(a) to Patent Application Nos. 2009-142688 filed in Japan on Jun. 15, 2009, 10-2009-0059142 filed in The Republic of Korea on Jun. 30, 2009 and Ser. No. 09/175,311.1 filed in Europe on Nov. 6, 2009, all of which are hereby expressly incorporated by reference into the present application.

FIELD OF THE INVENTION

The present invention concerns a temporary bonding adhesive for temporarily bonding a semiconductor wafer during processing, and a method for manufacturing a semiconductor device using the same, and use of a resin composition as a temporary bonding adhesive.

BACKGROUND OF THE INVENTION

In order to carry out processing such as grinding and etching on semiconductor wafers, it is necessary to temporarily bond semiconductor wafers, and various methods for doing so have been proposed. For example, at present, a method wherein a semiconductor wafer is bonded on top of a film for bonding that is a PET film whereon an adhesive layer has been provided is often used.

With this method, if the grinding precision (approximately 1 μm) of a back grinding machine generally used for grinding, and the thickness precision (approximately 5 μm) of a BG (back grind) tape generally used to fix a wafer are put together, the required thickness precision is exceeded, and there is the danger that variability in the thicknesses of the ground wafers may arise.

Additionally, when processing wafers used for through-silicon vias (TSVs), the formation of via holes and films is carried out in a state with a BG tape attached, but in these cases the temperature reaches approximately 150 degrees Celsius, and this unfortunately raises the adhesion of the BG tape. Additionally, the adhesive layer of the BG tape can be eroded by plating chemicals for film formation, and peeling can thereby occur.

Additionally, fragile wafers such as those in compound semiconductors may, in some cases, be damaged by mechanical grinding, so they are made thinner by etching. During this etching, there are typically no problems if the amount of etching is such that the aim is merely stress removal, but in cases where several microns worth of etching is done, the BG tape may be deteriorated by the etching chemicals.

On the other hand, a method has come to be utilized where bonding to a supporting substrate having a smooth surface is done, via a bonding adhesive. For example, when etching with the aim of stress removal, heating to a high temperature is necessary, but a PET film cannot withstand such a high temperature, so in such cases, a method using a supporting substrate is preferably utilized.

As the material for bonding to the supporting substrate, bonding materials that soften under high temperatures and thereby make the detachment of the wafer easy, and bonding materials that are dissolved by specific chemicals have been proposed.

However, the handling of such materials is poor, and after detachment, it is necessary to wash residual bonding material that has remained in the interior portions of the semiconductor wafer or device using chemicals or the like.

Additionally, when detaching the semiconductor wafer from the supporting substrate, there is the danger that the thinned wafer cannot withstand this and it breaks. As semiconductor wafers grow ever thinner, this probability can be expected to increase.

For example, Patent Documents 1 and 2 disclose polymers concerning the manufacture of a semiconductor device, although their aims differ from that of the present invention.

As described above, with regard to bonding in order to process a semiconductor wafer, a temporary bonding material was desired for which high precision processing is possible, it is easily detachable, and it does not readily remain on a semiconductor wafer.

Additionally, a manufacturing method for a semiconductor device that reduces the damage to semiconductor wafers, makes high precision processing possible, and can shorten the time needed for thermal decomposition was desired.

PRIOR ART DOCUMENTS

Patent Documents

Patent Document 1 JP-T 2006-504853
Patent Document 2 JP-T 2006-503335

SUMMARY OF THE INVENTION

The aim of the present invention is to provide a temporary bonding adhesive for a semiconductor wafer that reduces damage to the semiconductor wafer, allows for high precision processing, and for which the detachment of the semiconductor wafer after processing is easy, and a method for manufacturing a semiconductor device that reduces damage to the semiconductor wafer, allows for high precision processing, and can shorten the time needed for thermal decomposition.

According to the present invention, a temporary bonding adhesive for a semiconductor wafer is provided that temporarily bonds a semiconductor wafer to a supporting substrate for processing the semiconductor wafer, and that is used after processing for detaching the semiconductor wafer from the supporting substrate by heating. Said temporary bonding adhesive for a semiconductor wafer contains a resin composition such that its 50% weight loss temperature decreases after irradiation by active energy rays.

Additionally, in one mode of embodiment of the present invention, the difference between the 50% weight loss temperature before and after the aforementioned irradiation by active energy rays is 20 to 100 degrees Celsius.

Additionally, according to the present invention, a method for manufacturing a semiconductor device is provided, comprising a step wherein a temporary bonding adhesive for a semiconductor containing a resin composition such that its 50% weight loss temperature decreases after irradiation by active energy rays is provided on top of a supporting substrate in the form of a thin layer; a step wherein a semiconductor wafer is placed onto the surface of said supporting substrate provided with a thin layer, and the semiconductor wafer is stuck to said thin layer; a step wherein a semiconductor wafer is processed; a step wherein said thin layer is irradiated with active energy rays; and a step wherein said semiconductor wafer is removed from said supporting substrate by heating said thin layer.

The temporary bonding adhesive for a semiconductor wafer of the present invention has the effects of reducing damage to the semiconductor wafer, making high precision processing possible, and making the detachment of the semiconductor wafer after processing easy. Additionally, the method for manufacturing a semiconductor device using said temporary bonding adhesive for a semiconductor wafer has the effects of reducing damage to the semiconductor wafer, making high precision processing possible, and reducing the time needed for thermal decomposition.

EMBODIMENTS OF THE INVENTION

Defining Terms

In the present invention, the "50% weight loss temperature before and after exposure" refers to the temperature at which 50% of the weight is lost.

Additionally, "5% weight loss temperature" and "95% weight loss temperature" respectively refer to the temperature at which 5% and 95% of the weight is lost.

In the present invention, "active energy rays" refers to ultraviolet rays, visible light rays, infrared rays, electron beams, and the like.

Regarding the type of the aforementioned active energy rays, it is preferable for the aforementioned active energy rays to be ultraviolet or visible light, since they do not require any special devices, and are convenient.

Next, one mode of embodiment of the temporary bonding adhesive for a semiconductor wafer according to the present invention shall be explained.

[Temporary Bonding Adhesive for a Semiconductor Wafer]

The temporary bonding adhesive for a semiconductor wafer according to the present mode of embodiment is a temporary bonding adhesive for a semiconductor wafer that temporarily bonds a semiconductor wafer to a supporting substrate for processing the semiconductor wafer, and that is used after processing for detaching the semiconductor wafer from the supporting substrate by heating, containing a resin composition such that its 50% weight loss temperature decreases after irradiation by active energy rays.

Since the temporary bonding adhesive for a semiconductor wafer having the above constitution contains a resin composition such that its 50% weight loss temperature decreases after irradiation by active energy rays, it achieves the effects of being able to decrease the thermal decomposition temperature of the temporary bonding adhesive by irradiation with active energy rays, and making the semiconductor wafer readily detachable after processing, and the temporary bonding adhesive does not readily remain on the semiconductor wafer.

Additionally, since it can be formed as a thin layer on a supporting substrate having a smooth surface and with a sufficient precision, it achieves the effect of having a high precision for processing such as grinding.

It is more preferable for the aforementioned resin composition to be such that the difference between the 50% weight loss temperature before and after the aforementioned irradiation by active energy rays is 20 to 100 degrees Celsius.

Whereby, the effects of the semiconductor wafer being readily detachable, and the temporary bonding adhesive not readily remaining on the semiconductor after processing, can be still more improved.

Additionally, since the thermal decomposition temperature of the temporary bonding adhesive can be lowered by irradiation with active energy rays after the processing of the semiconductor, the effect of preventing damage due to the heat history of the semiconductor wafer after processing can be still more improved.

Additionally, regarding the aforementioned resin composition, it is desirable for the aforementioned difference between the 95% weight loss temperature and the 5% weight loss temperature after irradiation with active energy rays to be 1 degree Celsius≤(95% weight loss temperature)−(5% weight loss temperature)≤200 degrees Celsius.

Whereby, the effects of the temperature range needed for thermal decomposition of the temporary bonding adhesive being narrow, and shortening the time required for thermal decomposition, and suppressing damage to the semiconductor wafer, can be still more improved.

Additionally, the effects of the semiconductor wafer being readily detachable, and the temporary bonding adhesive not readily remaining on the semiconductor after processing, can be still more improved.

Additionally, since a wide temperature region over which it can be used stably can be secured, it can be subjected to various processing steps while still temporarily fixed to the supporting substrate.

Additionally, since it can be formed as a thin layer on a supporting substrate having a smooth and sufficiently precise surface, the effect of high precision during processing such as grinding can be still more improved.

Further, regarding the aforementioned resin composition, it is desirable for the aforementioned difference between the 95% weight loss temperature and the 5% weight loss temperature after irradiation with active energy rays to be 80 degrees Celsius≤(95% weight loss temperature)−(5% weight loss temperature)≤150 degrees Celsius.

Whereby, the effects of shortening the time needed for thermal decomposition, and securing a wide temperature region over which it can be used stably can be still more improved.

Additionally, it is preferable for the aforementioned temporary bonding adhesive to contain an activator that generates active species when energy is added by the irradiation of the aforementioned active energy rays, and for the decomposition temperature of the aforementioned resin composition to lower under the presence of said active species.

(Resin Composition)

The resin composition is not particularly restricted as long as its thermal decomposition temperature decreases due to irradiation by active energy rays, in the presence of an activator.

It is preferable for the aforementioned resin composition to be such that the main chain of the aforementioned resin composition is thermally cleaved, in the presence of the aforementioned active species. The reason for this is because, since the thermal decomposition temperature of the temporary bonding adhesive can be effectively decreased, damage due to the heat history of the semiconductor can be effectively prevented, and further, since the main chain of the aforementioned resin composition is thermally cleaved, and it vaporizes as a low molecular segment, the temporary bonding adhesive does not readily remain on the semiconductor wafer.

It is preferable for the aforementioned resin composition to be such that, in the presence of the aforementioned active species, thermal ring-closing reactions of the aforementioned resin composition are promoted. The reason for this is because, since the aforementioned resin composition undergoes thermal ring-closing, the aforementioned resin composition is more effectively made to readily thermally decompose.

It is preferable for the aforementioned resin composition to have an aliphatic quaternary carbon atom in the main chain. The reason for this is because the stability of the intermediate derived from the resin composition during thermal decomposition of the resin composition can be improved.

It is preferable for the aforementioned resin composition to have heteroatoms in the main chain. The reason for this is because this makes it easy for bond electrons to move, so the thermal decomposition and thermal ring closure reactions of the main chain will be promoted, so the thermal decomposition of the resin composition will readily occur.

Additionally, it is preferable for the aforementioned resin composition to have a tertiary carbon atom adjacent to a heteroatom of the main chain. The reason for this is because of the stability of the intermediate derived from the resin composition during thermal decomposition of the resin composition, and further because this makes it easy for bond electrons to move, and promotes thermal decomposition and thermal closure reactions of the main chain.

Here, "heteroatom" refers to an atom other than a hydrogen or carbon atom.

It is preferable for the aforementioned resin composition to be such that the number of repeating atoms in the main chain is 5 to 7. The reason for this is because if the number of repeating atoms is 5 to 7, a ring-shaped structure (5 to 7 membered ring) is readily formed, and the resin composition is readily thermally decomposed.

It is preferable for the aforementioned resin composition to have a X—C(=O)—Y structure in its main chain. Here, X and Y are each either an oxygen atom, a nitrogen atom, or a sulfur atom. The reason for this is because this makes it easy for bond electrons to move, so the thermal decomposition and thermal ring closing reactions of the main chain will be promoted, so the thermal decomposition of the resin composition will readily occur.

It is preferable for the aforementioned resin composition to have a primary or secondary carbon atom on the main chain, a functional group bonding to a side chain of said carbon atom. The reason for this is because the thermal decomposition of the main chain will be promoted by the functional group.

Additionally, it is preferable for the aforementioned functional group to be one of a carbonyl group, a thiocarbonyl group, a formal group, or an acetal group. The reason for this is because the thermal decomposition of the main chain will be more effectively promoted.

It is preferable for the aforementioned resin composition to be one of a polycarbonate based resin, a polyester based resin, a polyamide based resin, a polyimide based resin, a polyether based resin, a polyurethane based resin, or a (meta) acrylate based resin. The reason for this is because the thermal decomposition temperature in the presence of the activator can effectively be decreased.

Additionally, the aforementioned temporary bonding adhesive more preferably contains a photosensitive polycarbonate based resin, vinyl based resin, or (meta) acryl based resin.

A "photosensitive polycarbonate based resin" refers to a combination of the following polycarbonate based resins and the aforementioned activator.

The aforementioned polycarbonate based resin is not particularly restricted, but it may be, for example, polypropylene carbonate, polyethylene carbonate, 1,2-polybutylene carbonate, 1,3-polybutylene carbonate, 1,4-polybutylene carbonate, cis-2,3-polybutylene carbonate, trans-2,3-polybutylene carbonate, α,β-polyisobutylene carbonate, α,γ-polyisobutylene carbonate, cis-1,2-polycyclobutylene carbonate, trans-1,2-polycyclobutylene carbonate, cis-1,3-polycyclobutylene carbonate, trans-1,3-polycyclobutylene carbonate, polyhexene carbonate, polycyclopropene carbonate, polycyclohexene carbonate, poly (methylcyclohexene carbonate), poly (vinyl cyclohexene carbonate), polydihydro naphthalene carbonate, polyhexahydro styrene carbonate, polycyclohexane propylene carbonate, polystyrene carbonate, poly (3-phenyl propylene carbonate), poly (3-trimethyl silyloxypropylene carbonate), poly (3-methacryloyloxy propylene carbonate), polyperfluoro propylene carbonate, polynorbornene carbonate, poly (1,3-cyclohexylene carbonate), or a combination of two or more types thereof.

Among these, due to the reason that they can particularly lower the thermal decomposition temperature effectively in the presence of an activator, polypropylene carbonate, polycyclohexylene carbonate, and polybutylene carbonate are preferable.

The aforementioned vinyl based resin is not particularly restricted, but it may be, for example, a polymer of a styrene derivative such as polystyrene or poly-α-methylstyrene, a polyvinyl ether such as poly (ethylvinyl ether), poly (butylvinyl ether), polyvinyl formal, or the like, or a derivative thereof, or a combination of two or more types thereof.

Among these, due to the reason that it can particularly decrease the thermal decomposition temperature effectively by irradiation with active energy rays, and has excellent workability, poly-α-methylstyrene is preferable.

The aforementioned (meta) acryl based resin is not particularly restricted, but it may be, for example, a copolymer of (meta) acrylate based monomers selected from methyl (meta) acrylate, ethyl (meta) actylate, n-propyl (meta) acrylate, n-butyl (meta) acrylate, (meta) acrylate, 2-hydroxy ethyl (meta) acrylate, or the like.

Among these, due to the reason that they can particularly decrease the thermal decomposition temperature effectively by irradiation with active energy rays, and have excellent workability, methyl polymethacrylate and ethyl polymethacrylate are preferable.

The weight average molecular weight (Mw) of the aforementioned resin composition is preferably 1,000 to 1,000,00, and more preferably 5,000 to 800,000. By making the weight average molecular weight be above the abovementioned lower limit, the effects of improving the wettability of the temporary bonding adhesive to the semiconductor wafer or supporting body during the thin layer forming step, and further, improving layer formability can be achieved. Additionally, by making it lower than the aforementioned upper limit, the effects of compatibility with each of the compositions comprising the temporary bonding adhesive, and solubility in various types of solvents, and further, improved thermal decomposability of the temporary bonding adhesive during the heating step can be achieved.

It is preferable to blend in the aforementioned resin composition so that its proportion is 10% to 100% of the entire amount of the temporary bonding adhesive. More preferably, it should be blended in so that its proportion is 30% to 100%. The reason is because by making the contained amount of the resin composition greater than the abovementioned lower limit, the temporary bonding adhesive can be prevented from remaining on the semiconductor wafer or the supporting body.

Additionally, the aforementioned temporary bonding adhesive contains an activator that generates active species when energy is added by irradiating with the aforementioned active energy rays.

(Activator)

The aforementioned resin composition is not particularly restricted, but it may be, for example, a photo-acid generating agent, a photo-base generating agent, or the like. The aforementioned photo-acid generating agent is not particularly restricted, but it may be, for example, tetrakis(pentafluorophenyl)borate-4-methylphenyl[4-(1-methyl ethyl)phenyl]iodonium (DPI-TPFPB), tris(4-t-butyl phenyl)sulfonium tetrakis-(pentafluoro phenyl)borate (TTBPS-TPFPB), tris(4-t-butyl phenyl)sulfonium hexafluoro phosphate (TTBPS-HFP), triphenyl sulfonium trifurate (TPS-Tf), bis(4-tert-butyl phenyl)iodonium trifurate (DTBPI-Tf), triazine (TAZ-101), triphenyl sulfonium hexafluoro antimonate (TPS-103), triphenyl sulfonium bis(perfluoro methane sulfonyl)imide (TPS-N1), di-(p-t-butyl)phenyl iodonium, bis(perfluoromethane sulfonyl)imide (DTBPI-N1), triphenyl sulfonium, tris(perfluoromethane sulfonyl)methide (TPS-C1), di-(p-t-butyl phenyl)iodonium tris(perfluoromethane sulfonyl)methide (DTBPI-C1), or combinations of two or more types thereof.

Among these, due to the reason that it can decrease the thermal decomposition temperature of the aforementioned resin composition effectively, tetrakis(pentafluorophenyl)borate-4-methylphenyl[4-(1-methyl ethyl)phenyl]iodonium (DPI-TPFPB) is particularly preferable.

The aforementioned photo-base generating agent is not particularly restricted, but it may be, for example, 5-benzyl-1,5-diazabicyclo(4.3.0)nonene, 1-(2-nitro benzoyl carbamoyl)imidazole, or the like.

Among these, due to the reason that it can decrease the thermal decomposition temperature of the aforementioned resin composition effectively, 5-benzyl-1,5-diazabicyclo(4.3.0)nonene and derivatives thereof are particularly preferable.

It is preferable to blend in the aforementioned activator so that its proportion is 0.01% to 50% of the entire amount of the temporary bonding adhesive. It is more preferable for it to be blended in so that its proportion is 0.1% to 30% of the total amount.

By making this higher than the abovementioned lower limit, it becomes possible to decrease the thermal decomposition temperature of the aforementioned resin composition stably, and by making this lower than the abovementioned upper limit, it becomes possible to effectively prevent the temporary bonding adhesive from remaining on the semiconductor wafer or the supporting substrate as a residue.

Combinations of photosensitive polycarbonate based resins that are particularly preferable are polypropylene carbonate, 1,4-polybutylene carbonate, or neopentyl carbonate, and as an activator, tetrakis(pentafluorophenyl)borate-4-methylphenyl[4-(1-methyl ethyl)phenyl]iodonium (DPI-TPFPB).

In this case, it is preferable for the resin composition to be 30% to 100% of the entire amount of the temporary bonding adhesive, the activator to be 0.1% to 30% of the entire amount of the temporary bonding adhesive, and for the weight average molecular weight (Mw) of the temporary bonding adhesive to be 5,000 to 800,000. The reason for this is because this will secure wettability to the semiconductor wafer or the supporting body, layer formability of the temporary bonding adhesive, compatibility with each type of composition comprising the temporary bonding adhesive, solubility with each type of solvent, and further, the thermal decomposability of the temporary bonding adhesive during the heating step.

Since the aforementioned polycarbonate-based resin forms a structure wherein the main chain can readily be cleaved thermally in the presence of the aforementioned activator, or the polycarbonate-based resin itself forms a thermal closed ring structure that readily thermally decomposes (thermal ring closure reaction), the thermal decomposition temperature can be lowered.

The following reaction formula (I) shows the mechanisms of thermal bond cleavage of the main chain of a polypropylene carbonate resin and the formation of a thermal closed ring structure.

First, an $H^+$ derived from the aforementioned activator protonates a carbonyl oxygen of the propylene carbonate resin, and further shifts the polarity transition state, creating the tautomeric intermediate bodies [A] and [B].

Next, in the case of thermal cleavage of the main chain, the intermediate body [A] fragments into acetone and $CO_2$.

In the case of the formation of a thermal closed ring structure (a or b), the intermediate body [B] generates propylene carbonate, and the propylene carbonate fragments into $CO_2$ and propylene oxide.

[Formula 1]

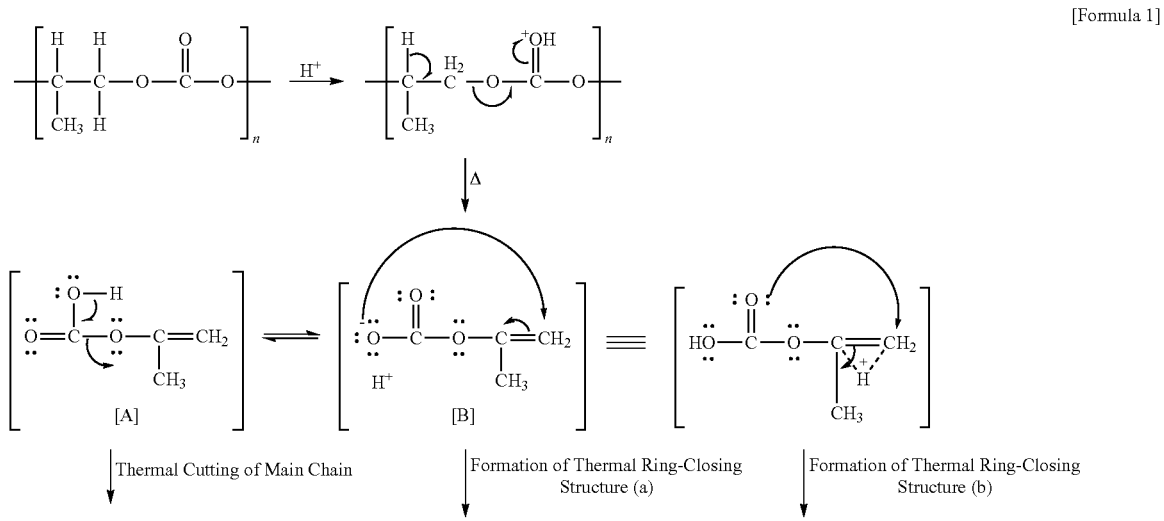

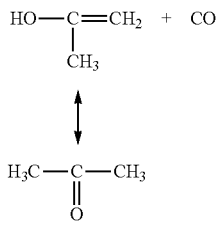
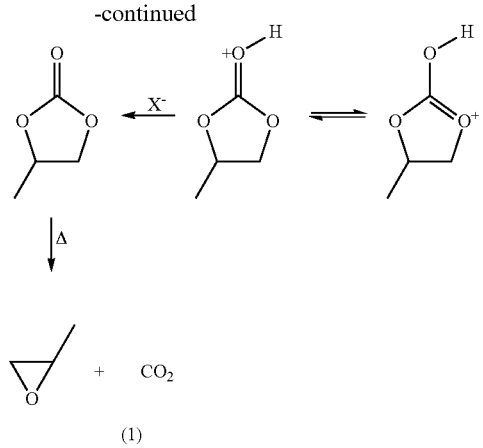

(1)

Additionally, the aforementioned temporary bonding adhesive may contain a solvent. The solvent is not particularly restricted, but it may be a hydrocarbon such as mesitylene, decalin, and mineral spirits; an alcohol or an ether such as anisole, propylene glycol monomethyl ether, dipropylene glycol methyl ether, diethylene glycol monoethyl ether, and diglyme; an ester or a lactone such as ethylene carbonate, ethyl acetate, N-butyl acetate, ethyl lactate, 3-ethoxypropionate ethyl, propylene glycol monomethyl ether acetate, diethylene glycol monoethyl ether acetate, propylene carbonate, and γ-butyrolactone; a ketone such as cyclopentanone, cyclohexanone, methyl isobutyl ketone, and 2-heptanone; or an amide or a lactam such as N-methyl-2-pyroridinone. Because the temporary bonding adhesive contains a solvent, the viscosity of the temporary bonding adhesive can be readily adjusted, and it becomes easy to form a thin layer of the temporary bonding adhesive on a semiconductor wafer or a supporting substrate.

The contained amount of the aforementioned solvent is not particularly restricted, but it is preferably 5 to 98 wt %, and is particularly preferably 10 to 95 wt %.

Additionally, the aforementioned temporary bonding adhesive may contain a photo-radical initiator. The photo-radical initiator is not particularly restricted, but by containing a photo-radical initiator, the temporary bonding adhesive will be such that, by undergoing an exposing and developing step, the temporary bonding adhesive can be formed at a given location.

The aforementioned photo-radical initiator is not particularly restricted, as long as it is a compound that it breaks down into two types of compounds or more by being irradiated with actinic rays, and at least one of the aforementioned compounds is a compound having free radicals, for example, bis(2,4,6-trimethyl benzoyl)-phenyl phosphin oxide (Irgacure 819, Ciba Specialty Chemicals Inc.), 2-benzyl-2-dimethyl amino-1-(4-morpholinophenyl)-butanone-1 (Irgacure 369, Ciba), 2,2-dimethoxy-1,2-diphenyl ethane-1-one (Irgacure 651, Ciba), 2-methyl-1[4-(methylthio)-phenyl]-2-morpholinopropane-1-one (Irgacure 907, Ciba), benzoin ethyl ether (BEE, Aldrich), 2-methyl-4'-(methylthio)-2-morpholino-propiophenone, 2,2'-dimethoxy-2-phenyl-acetophenone (Irgacure 1300, Ciba), 2,6-bis(4-azidobenzylidene)-4-ethyl cyclohexane (BAC-E), or the like.

The contained amount of the aforementioned photo-radical initiator, relative to 100 weight portions of the aforementioned resin composition, is preferably 0.1 to 10 weight portions, and is particularly preferably 0.5 to 5 weight portions.

The aforementioned temporary bonding adhesive may contain, along with the photo-radical initiator, a sensitizer that is a composition having the function of producing, or increasing, the reactivity of the photo-radical initiator.

The aforementioned sensitizer is not particularly restricted, but it may be, for example, anthracene, phenanthrene, chrysene, benzpyrene, fluoranthene, rubrene, pyrene, xanthone, indanthrene, thioxanthene-9-one, 2-isopropyl-9H-thioxanthene-9-one, 4-isopropyl-9H-thioxanthene-9-one, 1-chloro-4-propoxy thioxanthone, and mixtures thereof. The contained amount of such sensitizers, relative to a total of 100 weight portions for the activators such as the photo acid generating agent described above, and the photo-radical initiator, is preferably 100 weight portions or less, and more preferably 20 weight portions or less.

Additionally, the aforementioned temporary bonding adhesive may contain an antioxidant. The aforementioned antioxidant has the function of preventing the generation of undesirable acids, and the native oxidation of the resin composition.

The aforementioned antioxidant is not particularly restricted, but for example, Ciba IRGANOX (trademark) 1076, or Ciba IRGAFOS (trademark) 168, obtainable from Ciba Fine Chemicals Co. in Tarrytown, N.Y., can be used suitably.

Additionally, other antioxidants such as Ciba Irganox (trademark) 129, Ciba Irganox 1330, Ciba Irganox 1010, Ciba Cyanox (trademark) 1790, Ciba Irganox 3114, and Ciba Irganox 3125, or the like, may be used.

The contained amount of the aforementioned antioxidant, relative to 100 weight portions of the aforementioned resin composition, is preferably 0.1 to 10 weight portions, and is more preferably 0.5 to 5 weight portions.

Additionally, the aforementioned temporary bonding adhesive may contain, as needed, an additive agent such as an acryl based, silicone based, fluorine based, or vinyl based leveling agent, silane coupling agent, or diluent.

The aforementioned silane coupling agent is not particularly restricted, but it may, for example, be 3-glycidoxy propyl trimethoxy silane, 3-glycidoxy propyl methyl diethoxy silane, 3-glycidoxy propyl triethoxy silane, p-styryl trimethoxy silane, 3-methacryloxy propyl methyl dimethoxy silane, 3-methacryloxy propyl methyl trimethoxy silane, 3-methacryloxy propyl methyl diethoxy silane, 3-methacryloxy propyl triethoxy silane, 3-acryloxy propyl trimethoxy silane, N-2-(amino ethyl)-3-amino propyl methyl dimethoxy silane, N-2-(amino ethyl)-3-amino propyl trimethoxy silane, N-2-(amino ethyl)-3-amino propyl triethoxy silane, 3-amino propyl trimethoxy silane, 3-amino propyl triethoxy silane, N-phenyl-3-amino propyl trimethoxy silane, 3-mercapto propyl methyl dimethoxy silane, 3-mercapto propyl trimethoxy silane, bis(triethoxy propyl)tetrasulfide, or 3-isocyanate pryopyl triethoxy silane, and these may be used alone, or by blending two or more types.

By having the aforementioned temporary bonding adhesive contain a silane coupling agent, it becomes possible to improve adhesiveness to the semiconductor wafer or the supporting substrate.

The aforementioned diluent is not particularly restricted, but it may be, for example, a cycloether compound such as cyclohexane oxide or α-pinene oxide; an aromatic cycloether such as [methylene bis(4,1-phenylene oxymethylene)]bis oxirane; or a cycloaliphatic vinyl ether compound such as 1,4-cyclohexane dimethanol divinyl ether.

By having the aforementioned temporary bonding adhesive contain a diluent, the fluidity of the temporary bonding adhesive can be improved, and it becomes possible to improve the wettability of the temporary bonding adhesive to a semiconductor wafer or a supporting substrate during the layer forming step.

[Method for Manufacturing a Semiconductor Device]

Next, we shall explain one mode of embodiment of the method for manufacturing a semiconductor device of the present invention.

The method for manufacturing a semiconductor device according to the present mode of embodiment comprises a step wherein a temporary bonding adhesive for a semiconductor wafer containing a resin composition such that its 50% weight loss temperature decreases after irradiation by active energy rays is provided on top of a supporting substrate in the form of a thin layer; a step wherein a semiconductor wafer is placed upon the surface of the aforementioned supporting substrate whereon the thin layer was provided; a step wherein said semiconductor wafer is stuck together with the aforementioned thin layer; a step wherein the aforementioned semiconductor wafer is processed; a step wherein the aforementioned thin layer is irradiated with active energy rays; and a step wherein the aforementioned semiconductor wafer is removed from the aforementioned supporting substrate by heating the aforementioned thin layer.

The manufacturing method for a semiconductor device comprising the abovementioned constitution, since it contains a resin composition such that its 50% weight loss temperature decreases after irradiation by active energy rays, achieves the effects of being able to lower the thermal decomposition temperature of the temporary bonding adhesive by irradiation with active energy rays, making the detachment of the semiconductor wafer after processing easy, and making it difficult for the temporary bonding adhesive to remain on the semiconductor wafer. Whereby, damage to the semiconductor can be reduced, and the time required for thermal decomposition can be shortened.

Additionally, since it can be formed as a thin layer on top of a supporting substrate having a smooth and sufficiently precise surface, it achieves the effect of having a high precision during processing such as grinding.

Further, in the manufacturing method for a semiconductor device according to the present mode of embodiment, as a temporary bonding adhesive for a semiconductor wafer, the abovementioned temporary bonding adhesive is utilized. That is, the temporary bonding adhesive used in the manufacturing method for a semiconductor device according to the present mode of embodiment has the features of the abovementioned temporary bonding adhesive.

Herebelow, we shall explain each of the steps of the aforementioned manufacturing method for a semiconductor device.

(Thin Layer Forming Step)

First, the step where a thin layer of a temporary bonding adhesive is provided on a supporting substrate or a semiconductor wafer, in order to fix a semiconductor wafer on a given supporting substrate, is carried out. The thin layer of a temporary bonding adhesive may be provided on either one of the supporting substrate or the semiconductor wafer.

Regarding a method for providing the temporary bonding adhesive in the form of a thin layer, it can be carried out using a publicly known method such as the spin coating method, spray method, printing method, layer transcription method, slit coat method, scanning coating method, and the like, so there is the advantage that no new investments in facilities are needed.

As a method for providing the temporary bonding adhesive in the form of a thin layer, the spin coating method is preferable, and it is preferable because it can form a uniform and flat thin layer.

(Bonding Together Step)

Next, the step in which the aforementioned supporting substrate or semiconductor wafer is placed upon the surface of the supporting substrate or the semiconductor wafer whereon a thin layer is provided, and the aforementioned supporting substrate or semiconductor wafer is stuck together with the aforementioned thin layer is carried out. For the sticking together, a device such as a vacuum press or a wafer bonder or the like may be used.

(Processing Step)

Next, the step wherein the semiconductor wafer that has been bonded on top of the supporting substrate with the temporary bonding adhesive is processed is carried out.

The processing of the semiconductor wafer is grinding of the rear surface of the semiconductor wafer, etching for stress release, forming of via holes, lithography, coating, vapor deposition, and the like.

In the method for manufacturing a semiconductor device according to the present mode of embodiment, it can be formed as a thin layer on top of a supporting substrate having a smooth and sufficiently precise surface, so the effect of high precision in processing can be achieved.

(Active Energy Ray Irradiation Step)

Next, the step wherein the temporary bonding adhesive in a thin layer state is irradiated with active energy rays.

In this irradiation step, by irradiating the temporary bonding adhesive with active energy rays, active species are generated from the activator in the temporary bonding adhesive. Then, due to said active species, the thermal decomposition temperature of the resin composition decreases.

Further, this irradiation step may also be carried out prior to the processing step.

(Heating Step)

Next, a step in which the temporary bonding adhesive in the form of a thin layer is heated and removed is carried out.

For the temporary bonding adhesive in the form of a thin layer, due to the aforementioned irradiation step, the thermal decomposition temperature has been decreased, so that it can be removed at a lower temperature than the heating temperature for a conventional heating step. Whereby, damage to the semiconductor wafer can be decreased, and the time required for thermal decomposition can be shortened.

(Detachment Step)

Next, the step of detaching the semiconductor wafer from the supporting substrate is carried out.

Here, "detachment" refers to the operation wherein the semiconductor wafer is peeled away from the supporting substrate. For example, this operation may be carried out by the method of detaching in the vertical direction relative to the surface of the supporting substrate, the method of detaching by sliding in the horizontal direction relative to the surface of the supporting substrate, or the method of detaching by tilting up the semiconductor wafer from one side of the semiconductor wafer.

After the detaching step, residual temporary bonding adhesive that has remained on the semiconductor wafer or the supporting substrate may be removed. The removal method for the residual temporary bonding adhesive is not particularly restricted, but it may, for example, be plasma treatment, chemical immersion treatment, grinding treatment, or heat treatment.

In the manufacturing method for a semiconductor device according to the present embodiment, the temporary bonding adhesive is put into low molecular form, making detachment without stress possible, so it achieves the effect of making it difficult to sustain damage and the like to the semiconductor wafer.

Additionally, the compositions of the temporary bonding adhesive, having been put into a low molecular form, vaporizes during heating, thereby achieving the effect of making it difficult for residual temporary bonding adhesive to remain on the semiconductor wafer. Whereby, later steps such as washing and the like can be simplified, and there is the advantage of improved handling.

Concrete examples of a temporary bonding adhesive for a semiconductor wafer according to the present invention, a manufacturing method for a semiconductor device using it have been explained above, giving modes of embodiment, but the present invention is not limited to these.

EXAMPLES

Herebelow, a detailed description of the temporary bonding adhesive for a semiconductor wafer, and a manufacturing method for a semiconductor device of the present invention, shall be explained using embodied examples, but the present invention is not limited to the embodied examples described below.

Production of Temporary Bonding Adhesive

Embodiment 1

In Embodiment 1, a temporary bonding adhesive was produced using the following compound.

Synthesis of 1,4-polybutylane carbonate

In a three neck flask provided with an agitator, a raw material loading opening, and a nitrogen gas introduction opening, 1,4-butanediol (168 g, 1.864 mol) and diethyl carbonate (264.2 g, 2.236 mol) were added, heated to 90 to 100 degrees Celsius under a nitrogen atmosphere, and the mixture was dissolved. Next, after adding a 20% sodium ethoxide ethanol solution (80 ml, 0.186 mol), this was agitated for one hour at 90 to 100 degrees Celsius under a nitrogen atmosphere. After this, the interior of the reaction container was depressurized by around 30 kPa, and left at 90 to 100 degrees Celsius for 1 hour, and 120 degrees Celsius for 1 hour. After this, in a vacuum of 0.1 kPa, agitation was done for 1 hour at 150 degrees Celsius, and for 2 hours at 180 degrees Celsius.

The reactants obtained above were dissolved in tetrahydrofuran (2 L), filtering was done, and the catalysis residue was removed. After this, this filtered liquid was put into a distilled water:methanol=1:9 solution (20 L), the precipitate was collected, and this was further washed sufficiently in a distilled water:methanol=1:9 solution (10 L), and 125 g of 1,4-polybutylene carbonate (yield 48%) was obtained. When the weight average molecular weight of the synthesized 1,4-polybutylene carbonate was measured by GPC, it was found to be 35,000.

<Production of Temporary Bonding Adhesive>

100 g of the obtained 1,4-polybutylene carbonate, 5 g of Rhodosil Photo Photoinitiator 2074 (FABA) (Manufactured by Rhodia Japan, Rhodorsil Photiniaiator 2074) as an activator, and 1.5 g of 1-chloro-4-propoxythioxanthone (Manufactured by Lambson Ltd. (UK), Product name: SPEEDCURE CPTX) as a sensitizer were dissolved in 958.5 g of anisole (solvent), and a temporary bonding adhesive with a resin concentration of 10% was produced.

Embodiment 2

For Embodiment 2, a temporary bonding adhesive was produced using the following compound.

<Synthesis of Polyneopentyl Carbonate>

In a three neck flask provided with an agitator, a raw material loading opening, and a nitrogen gas introduction opening, neopentyl glycol (194.2 g, 1.864 mol) and diethyl carbonate (308.2 g, 2.610 mol) were added, heated to 120 degrees Celsius under a nitrogen atmosphere, and the mixture was dissolved.

Next, after adding a 20% sodium ethoxide ethanol solution (80 ml, 0.186 mol), this was agitated for 2 hours at 120 degrees Celsius under a nitrogen atmosphere. After this, the interior of the reaction container was depressurized by around 30 kPa, and agitated at 120 degrees Celsius for 1 hour. After this, in a vacuum of 0.1 kPa, agitation was done for 3 hours at 120 degrees Celsius.

The reactants obtained above were dissolved in tetrahydrofuran (2 L), filtering was done, and the catalysis residue was removed. After this, this filtered liquid was put into a distilled water:methanol=1:9 solution (20 L), the precipitate was collected, and this was further washed sufficiently in a distilled water:methanol=1:9 solution (10 L), and 110.6 g of polyneopentyl carbonate (yield 46%) was obtained.

When the weight average molecular weight of the synthesized polyneopentyl carbonate was measured by GPC, it was found to be 12,000.

<Production of the Temporary Bonding Adhesive>

100 g of the obtained polyneopentyl carbonate, 5 g of Rhodosil Photo Photoinitiator 2074 (FABA) (Manufactured by Rhodia Japan, Rhodorsil Photiniaiator 2074) as an activator, and 1.5 g of 1-chloro-4-propoxythioxanthone (Manufactured by Lambson Ltd. (UK), Product name: SPEEDCURE CPTX) as a sensitizer were dissolved in 958.5 g of anisole (solvent), and a temporary bonding adhesive with a resin concentration of 10% was produced.

Embodiment 3

In Embodiment 3, a temporary bonding adhesive was produced using the following compounds.

<Synthesis of poly (1,3-cyclohexylene carbonate)>

8.13 g (0.070 mole) of 1,3-cyclohexane diol, 15.00 g (0.070 mole) of diphenyl carbonate and 0.0028 g (0.0035 mole) of lithium carbonate were placed in a reaction container. As the first step of the reaction, the reaction container was immersed and agitated in a heating chamber heated to 120 degrees Celsius under a nitrogen atmosphere, the ingredients were dissolved and agitation was continued for 2 hours. As the second step of the reaction, the interior of the reaction container was depressurized to 10 kPa, and agitation was continued at 120 degrees Celsius for 1 hour. As the third step of the reaction, the interior of the reaction container was depressurized to 0.5 kPa or less, and agitation was continued at 120 degrees for 1 hour. As the fourth step of the reaction, after raising the temperature of the heating chamber to 180 degrees Celsius over a period of 30 minutes while maintaining the interior of the reaction container depressurized at 0.5 kPa or less, agitation was continued at 180 degrees Celsius for 1.5 hours. The phenol generated during the second to the fourth steps of the reaction was evaporated to the outside of the reaction container.

After restoring the pressure inside the reaction container to normal pressure, 100 ml of tetrahydrofuran was added to dissolve the product. The solution in which the produce was dissolved was dripped into 1.0 L of a mixed solution of methanol:water=9:1 (v/v) that was being agitated. The separated out precipitates were collected by suction filtration, and after washing the collected precipitates with 0.5 L of the mixed solution of methanol:water=9:1 (v/v), they were collected by suction filtration. The collected precipitates were dried for 18 hours at 60 degrees Celsius in a vacuum dryer and 7.09 g of a 1,3-cyclohexylene carbonate powder (yield: 71%) was obtained.

When the weight average molecular weight of the synthesized poly (1,3-cyclohexylene carbonate) was measured by GPC, it was found to be 23,100 and the molecular weight distribution was 1.49.

<Production of the Temporary Bonding Adhesive>

100 g of the obtained poly (1,3-cyclohyxylene carbonate), 5 g of Rhodosil Photoinitiator 2074 (Manufactured by Rhodia Japan) as an activator, and 1.5 g of 1-chloro-4-propoxythioxanthone (Manufactured by Lambson Ltd. (UK), Product name: SPEEDCURE CPTX) as a sensitizer were dissolved in 958.5 g of anisole (solvent), and a temporary bonding adhesive with a resin concentration of 10% was produced.

Regarding the temporary bonding adhesive of the abovementioned Embodiment 1 to 3, the 50% weight loss temperature before and after exposure, and the 5% weight loss temperature and the 95% weight loss temperature after exposure of the temporary bonding adhesive was measured by a TG/DTA device (Model Number: 6200, Manufactured by Seiko Instruments) (atmosphere: nitrogen, rate of temperature rise: 5 degrees per minute).

Here, the temporary bonding adhesive after exposure was produced by coating an 8 inch transparent glass with the temporary bonding adhesive obtained in the embodiments using a spin coater (rotation rate: 1,200 rpm, time: 30 sec), and next, pre-baking was done for 5 minutes at 120 degrees Celsius, and next, using a mask aligner (Model Number: MA-8, SUSS MicroTec), the thin layer was exposed (Exposure Amount: 500 mj/cm$^2$ i line equivalent) to a broadband light source (G line+H line+i line).

TABLE 1

|  | Emb. 1 | Emb. 2 |
| --- | --- | --- |
| Polyneopentyl carbonate Mw: 12,000 |  | 100 g |
| 1,4-polybutylene carbonate Mw: 35,000 | 100 g |  |
| Rhodorsil Photoinitiator 2074 | 5 g | 5 g |
| SPEEDCURE CPTX | 1.5 g | 1.5 g |
| 50% weight loss temp. prior to exposure (deg. C.) | 231 | 210 |

TABLE 1-continued

|  | Emb. 1 | Emb. 2 |
| --- | --- | --- |
| 50% weight loss temp. after exposure (deg. C.) | 146 | 167 |
| Difference in 50% w.l.t. before and after exposure (deg. C.) | 85 | 43 |
| 95% weight loss temp. after exposure (deg. C.) | 215 | 265 |
| 5% weight loss temp. after exposure (deg. C.) | 119 | 118 |
| (95% w.l.t. after exposure) − (5% w.l.t. after exposure) (deg. C.) | 96 | 147 |

TABLE 2

|  | Emb. 3 |
| --- | --- |
| Poly (1,3-cyclohexylene carbonate) | 100 g |
| Rhodorsil Photoinitiator 2074 | 5 g |
| SPEEDCURE CPTX | 1.5 g |
| Anisole | 958.5 g |
| 50% weight loss temp. prior to exposure (deg. C.) | 203 |
| 50% weight loss temp. after exposure (deg. C.) | 171 |
| Difference in 50% w.l.t. before and after exposure (deg. C.) | 33 |
| 95% weight loss temp. after exposure (deg. C.) | 321 |
| 5% weight loss temp. after exposure (deg. C.) | 143 |
| (95% w.l.t. after exposure) − (5% w.l.t. after exposure) (deg. C.) | 179 |

Next, using the temporary bonding adhesive according to the abovementioned Embodiments, the manufacturing of a semiconductor device was carried out.

First, using a spin coater, the temporary bonding adhesive obtained in the embodiments was coated onto an 8 inch transparent glass (rotation rate: 1,200 rpm, time: 30 sec), and next, prebaking was carried out for 5 minutes at 120 degrees Celsius on a hot plate, forming a thin layer comprising the temporary bonding adhesive having a thickness of 5 μm.

Next, using a substrate bonder (Model Number SB-8e, Manufactured by SUSS MicroTec), an 8 inch silicon wafer (thickness 725 μm) was temporarily bonded to the 8 inch transparent glass via the thin layer comprising the temporary bonding adhesive (atmosphere: 10$^{-2}$ mbar, Temperature: 160 degrees Celsius, Load: 10 kN, Time: 1 minute).

Next, using a mask aligner (Model Number: MA-8, SUSS MicroTec), the thin layer was exposed (Exposure Amount: 500 mj/cm$^2$ i line equivalent) to a broadband light source (G line+H line+i line).

Next, the sample, having an 8 inch silicon wafer temporarily bonded to an 8 inch transparent glass was put into an oven, and thermal decomposition of the temporary bonding adhesive was carried out by carrying out a given temperature and time treatment.

Finally, the sample that underwent thermal decomposition was taken out of the oven, tweezers were inserted in the space between the 8 inch transparent glass and the 8 inch silicon wafer, and the detachment of the 8 inch silicon wafer was carried out. At this time, since the temporary bonding adhesives of Embodiment 1 and Embodiment 2 were used, the 8 inch silicon wafer could be detached without damage and easily.

In this way, by using the temporary bonding adhesive according to the present invention, during the manufacturing method for a semiconductor device, detachment can be done easily, and the time required for thermal decomposition can be shortened. Whereby, damage to the semiconductor wafer can be reduced.

The invention claimed is:

1. A temporary bonding adhesive for a semiconductor wafer, used for temporarily bonding a semiconductor wafer onto a supporting substrate in order to process a semiconductor wafer, and for detaching a semiconductor wafer from a supporting substrate by heating after processing, said temporary bonding adhesive containing:

a resin composition wherein a 50% weight loss temperature decreases after irradiation by active energy rays; and an activator that generates active species when energy is added by irradiation with said active energy rays, wherein the activator is a photo-acid generating agent, and the resin composition comprises at least one resin selected from the group consisting of polypropylene carbonate, polycyclohexylene carbonate, polybutylene carbonate, and polyneopentyl carbonate.

2. The temporary bonding adhesive for a semiconductor wafer according to claim 1, wherein the difference in the 50% weight loss temperature before and after irradiation by said active energy rays is 20 to 100 degrees Celsius.

3. The temporary bonding adhesive for a semiconductor wafer according to claim 1, wherein said resin composition is such that the difference between the 95% weight loss temperature and the 5% weight loss temperature after irradiation by said active energy rays is 1 degree Celsius≤(95% weight loss temperature)−(5% weight loss temperature)≤200 degrees Celsius.

4. The temporary bonding adhesive for a semiconductor wafer according to claim 1, wherein said resin composition is such that the difference between the 95% weight loss temperature and the 5% weight loss temperature after irradiation by said active energy rays is 80 degrees Celsius≤(95% weight loss temperature)−(5% weight loss temperature)≤150 degrees Celsius.

5. The temporary bonding adhesive for a semiconductor wafer according to claim 1, wherein the decomposition temperature of said resin composition decreases in the presence of said active species.

6. The temporary bonding adhesive for a semiconductor wafer according to claim 1, wherein the main chain of said resin composition is thermally cleaved, in the presence of said active species.

7. The temporary bonding adhesive for a semiconductor wafer according to claim 1, wherein a thermal ring-closing reaction of said resin composition is promoted in the presence of said active species.

8. The temporary bonding adhesive for a semiconductor wafer according to claim 1, wherein said resin composition has an aliphatic quaternary carbon atom in its main chain.

9. The temporary bonding adhesive for a semiconductor wafer according to claim 1, wherein said resin composition has a heteroatom in its main chain.

10. The temporary bonding adhesive for a semiconductor wafer according to claim 9, wherein said resin composition has a tertiary carbon atom adjacent to a heteroatom of its main chain.

11. The temporary bonding adhesive for a semiconductor wafer according to claim 1, wherein said resin composition is such that the number of repeating atoms in the main chain is 5 to 7.

12. The temporary bonding adhesive for a semiconductor wafer according to claim 1, wherein said resin composition has a X—C(=O)—Y structure in its main chain, wherein X and Y are each an oxygen atom, a nitrogen atom, or a sulfur atom.

13. The temporary bonding adhesive for a semiconductor wafer according to claim 1, wherein said resin composition has a primary or secondary carbon atom in its main chain, and a functional group bonds to a side chain of said carbon atom.

14. The temporary bonding adhesive a semiconductor wafer according to claim 13, wherein said functional group is a carbonyl, a thiocarbonyl, a formal, or an acetal.

15. The temporary bonding adhesive for a semiconductor wafer according to claim 1, wherein said at least one resin is one of polypropylene carbonate, polycyclohexylene carbonate, or polybutylene carbonate.

16. The temporary bonding adhesive for a semiconductor wafer according to claim 1, wherein said active species is an acid or a base.

17. The temporary bonding adhesive for a semiconductor wafer according to claim 1, wherein said active energy rays are ultraviolet or visible light.

18. The temporary bonding adhesive for a semiconductor wafer according to claim 1, wherein said temporary bonding adhesive for a semiconductor wafer contains a photosensitive polycarbonate based resin.

19. A manufacturing method for a semiconductor device comprising steps of:

providing a thin layer of a temporary bonding adhesive on a top surface of a supporting substrate or semiconductor wafer;

placing a supporting substrate or a semiconductor wafer onto the surface of said supporting substrate or semiconductor wafer provided with a thin layer, so that the supporting substrate or the semiconductor wafer is stuck to said thin layer;

processing said semiconductor wafer; and removing said semiconductor wafer from said supporting substrate by heating said thin layer, wherein said temporary bonding adhesive comprises:

a resin composition wherein a 50% weight loss temperature decreases after irradiation by active energy rays; and an activator that generates active species when energy is added by irradiation with said active energy rays, wherein the activator is a photo-acid generating agent, and the resin composition comprises at least one resin selected from the group consisting of polypropylene carbonate, polycyclohexylene carbonate, polybutylene carbonate, and polyneopentyl carbonate.

20. The manufacturing method for a semiconductor device according to claim 19, wherein the decomposition temperature of said resin composition decreases in the presence of said active species.

21. The manufacturing method for a semiconductor device according to claim 19, wherein said at least one is one of polypropylene carbonate, polycyclohexylene carbonate, or polybutylene carbonate.

22. The temporary bonding adhesive for a semiconductor wafer according to claim 1, wherein said activator containing at least one photo-acid generating agents is selected from the group consisting of tetrakis(pentafluorophenyl)borate-4-methylphenyl[4-(1-methyl ethyl)phenyl]iodonium (DPI-TPFPB), tris(4-t-butyl phenyl)sulfonium tetrakis-(pentafluoro phenyl)borate (TTBPS-TPFPB), tris(4-t-butyl phenyl)sulfonium hexafluoro phosphate (TTBPS-HFP), triphenyl sulfonium trifurate (TPS-Tf), bis(4-tert-butyl phenyl)iodonium trifurate (DTBPI-Tf), triazine (TAZ-101), triphenyl sulfonium hexafluoro antimonate (TPS-103), triphenyl sulfonium bis(perfluoro methane sulfonyl)imide (TPS-N1), di-(p-t-butyl)phenyl iodonium, bis(perfluoromethane sulfonyl)imide (DTBPI-N1), triphenyl sulfonium, tris(perfluoromethane sulfonyl)methide (TPS-C1), and di-(p-t-butyl phenyl)iodonium tris(perfluoromethane sulfonyl)methide (DTBPI-C1).

23. The temporary bounding adhesive for a semiconductor wafer according to claim 1, wherein the photo-acid generating agent is tetrakis(pentafluorophenyl)borate-4-methylphenyl[4-(1-methyl ethyl)phenyl]iodonium (DPI-TPFPB).

* * * * *